PARAMETRIC AMPLIFIER DEVICE

Filed May 5, 1959

INVENTOR.
RICHARD M KURZROK
BY [signature]
ATTORNEY

United States Patent Office 2,970,275

Patented Jan. 31, 1961

2,970,275

PARAMETRIC AMPLIFIER DEVICE

Richard M. Kurzrok, Massapequa Park, N.Y., assignor to Radio Corporation of America, a corporation of Delaware Filed May 5, 1959, Ser. No. 811,137

10 Claims. (Cl. 330—5)

The present invention comprises an improved non-degenerate parametric amplifier (sometimes referred to as a reactance amplifier) utilizing a non-linear capacitance and characterized by low noise and relatively high sensitivity to an input signal, and eliminates the need for applied external magnetic fields and critical phase relationships between applied signals.

The term "parametric amplifier" is deemed to include a device used as a straight amplifier to amplify a radio frequency input signal (i.e. input signal and output signal at the same frequency) as well as one which converts such an input signal to a higher radio frequency signal.

Stated generally, the parametric amplifier of the invention employs a waveguide cross consisting of a pair of waveguides of different dimensions positioned at right angles to each other, either in the same plane or superposed on one another, a coaxial line low pass filter to supply a useful radio frequency input signal to the amplifier, and a diode operating on the non-linear reactance characteristic thereof for receiving the input signal. This diode is, effectively, a capacitance and positioned in both waveguides in a region intermediate the ends thereof. A pump voltage which differs from a two-to-one frequency relationship with regard to frequency of the useful input signal is supplied to one of the waveguides. The amplitude of the pump controls the gain of the amplifier. The other waveguide is tuned to act as an idling resonant circuit which is coupled to the non-linear diode. In the embodiment of the invention which is used as a straight amplifier solely to amplify the useful input radio frequency signal, there is provided an output coaxial line low pass filter coupled to the diode for deriving an amplified version of the useful input frequency and of the same frequency as the input signal. The coaxial line low pass filters are important because they permit signal transmission from input to output while bypassing both the idler and pump frequencies. In the embodiment of the invention which is used as an up-converter, a single coaxial line low pass input filter is employed, and the amplified high frequency is derived from the idler waveguide.

The non-linear diode capacitor used in the parametric amplifier of the invention is a voltage actuated element. Heretofore, coaxial line low pass filters have been avoided in parametric amplifiers because the electric field vector in coaxial lines in their customary orientation is parallel to the "plates" of the diode capacitor and, it would seem, thus fail to couple to the voltage actuated amplifier diode. I have found, however, that the waveguide-coaxial line junction distorts the electric field of the coaxial line low pass filter so that the electric field in the junction area has an appreciable component which is perpendicular to the "plates" of the diode capacitor and hence does couple to the voltage actuated amplifier diode. Such an arrangement is highly practical and efficient, and avoids the need for a resonant circuit in the input line. The use of the diode, in contrast to the use of an inductive reactance, avoids the need for an externally applied magnetic field. The parametric amplifier of the invention is very simple to tune and its design is such that it can accommodate a very broad range of signal input frequencies; for example, 400 mc. (megacycles) to 6000 mc. (megacycles); stated another way, the position of the amplifier response with a typical bandwidth of 1–15 megacycles can be varied over this very broad tuning range of 400 mc. to 6000 mc. Amplifier performance can be characterized by a gain-bandwidth product that is a function of circuit losses and the diode.

A more detailed description of the invention follows, in conjunction with a drawing, wherein.

Figures 1, 2, 3:
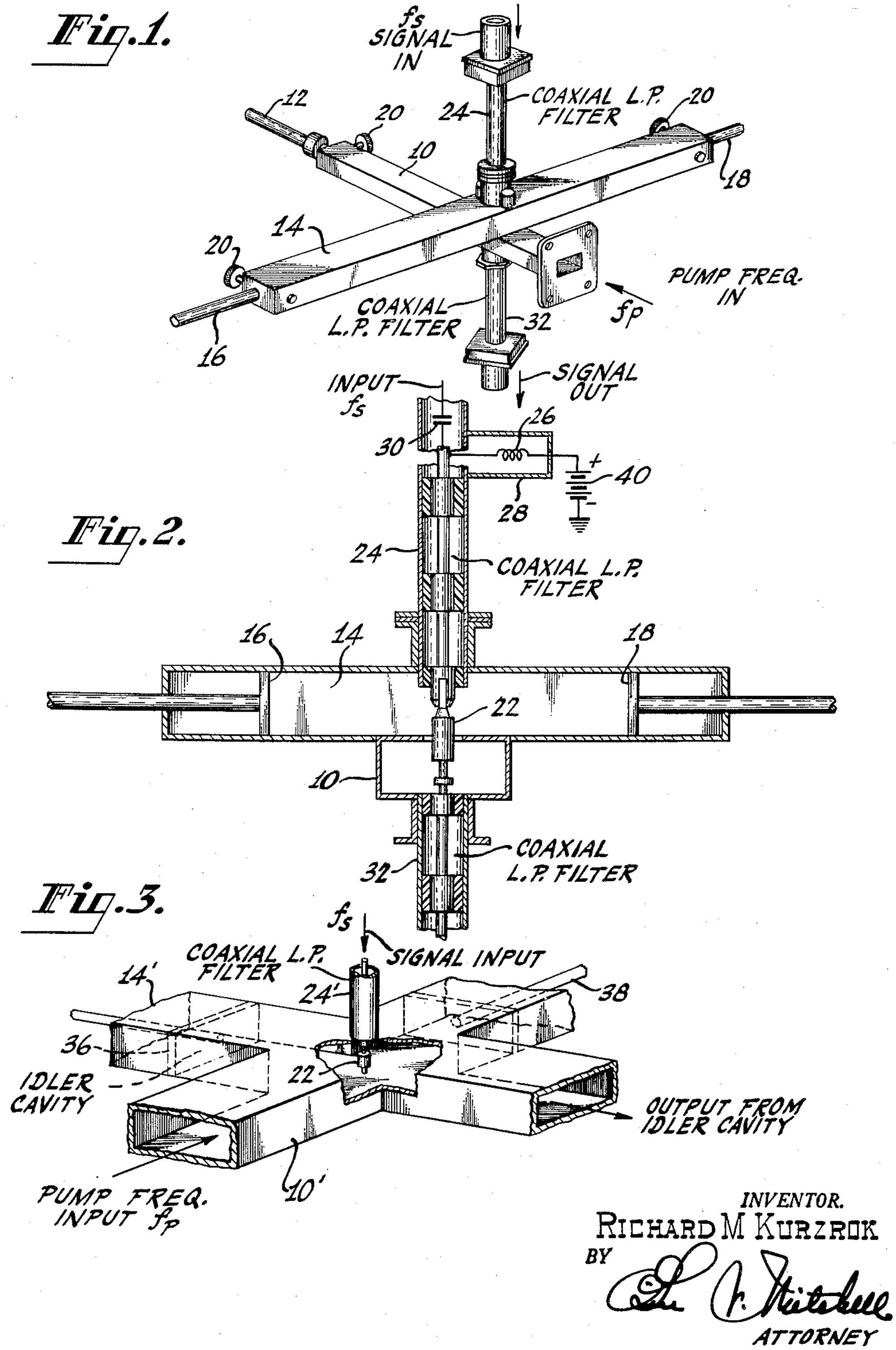
Figure 1 is a perspective view of the parametric amplifier of the invention used as a straight amplifier of microwave input signals.
Figure 2 is a vertical section through the idler cavity of Figure 1, and shows in addition a lumped-constant equivalent of a circuit for applying a bias voltage to the input coaxial line low pass filter.
Figure 3 illustrates another embodiment of the invention partly cut away, used as an up-converter.

The straight parametric amplifier of Figures 1 and 2 employs a waveguide cross made up of a waveguide 10 at one end of which there is supplied a high radio frequency pumping frequency *fp*, and another waveguide 14 which is at right angles to the first waveguide and which is provided with tuning plungers 16 and 18 at the ends thereof. The plungers are individually adjustable by pinion and rack mechanisms, the control knobs of which are shown as 20. The waveguide 14 is wider than waveguide 10 and constitutes an idler resonant circuit (tank) tuned to a high radio frequency *fi*. Although the waveguides are shown superposed on one another they can, if desired, be in the same plane.

Within both waveguides and positioned in a region between the ends thereof, there is provided a diode capacitor 22 which operates on the non-linear reactance characteristic thereof. The capacitor reactance 22 may be a diffused silicon junction diode, although other suitable diodes made from germanium, and so on, can be used. This diode should have a high order of non-linear reactance and as little resistance loss as possible. The diode should preferably have a non-linear reactance characteristic of the 3rd order or greater. One end of the diode is connected to a coaxial line low pass filter 24 to which is supplied the useful radio frequency input signal *fs* to be amplified. A suitable direct current (D.C.) voltage is supplied to the diode 22 through the input coaxial line low pass filter by battery 40 over a path containing a short-circuited stub 26 that is part of the monitor T 28. This stub acts as an RF choke. To arrive at the proper D.C. voltage to apply to the diode 22, a low frequency (10 mc.–50 mc.) curve of capacitance versus bias voltage is obtained through well known A.C. measurement procedures. This should be done for each type of diode to be considered for use in the parametric amplifier. A D.C. blocking condenser 30 serves to prevent the D.C. voltage supplied by battery 40 from entering the input circuit beyond the condenser 30. An output coaxial line low pass filter 32 is coupled to the other end of the diode 22. It is understood that a suitable ground return is provided for the D.C. path via the output coaxial line low pass filter 32.

The coaxial line low pass filters permit signal transmission from input to output while bypassing the idle and pump frequencies. The larger waveguide 14 passes both the idle and pump frequencies. The smaller waveguide 10 acts as a high pass filter to the idler frequency but passes the pump frequency. Since the pump frequency is higher than the idler frequency, the waveguide 10 is shown as narrower than the waveguide 14. The smaller dimensions of the waveguide 10 are determined so that the waveguide 10 supports only the pump frequency and not the idler frequency or lower frequency. Both waveguides 10 and 14 are cut off to the signal frequency.

In one embodiment of a parametric amplifier successfully constructed and satisfactorily tested, satisfactory results were obtained for input signal frequencies *fs* of 2000 mc. and 6000 mc., with the idler resonant circuit 14 tuned to 8500 mc. *fi*, and pump frequencies *fp* of 10,500 mc. and 14,500 mc., respectively, supplied to the waveguide 10. The tuning procedure using the tuning plungers was straightforward and simple. The idle tank 14 was tuned first. Then the pump waveguide was tuned. The signal frequency was tuned with external stub tuners, although such stub tuners need not be employed. To obtain gain, the frequency relation to be satisfied is $fp=fs+fi$, or $fi=fp-fs$, corresponding to the lower side band. The upper side band $fi=fp+fs$ is substantially suppressed because of the tuning of the idler tank circuit 14. The output frequency obtained from coaxial line low pass filter 32 has the same frequency as the useful input frequency supplied to the coaxial line input low pass filter 24. Gains in excess of 20 db have been obtained by using the parametric amplifier of the invention at these signal frequencies of 2000 mc. and 6000 mc. An amplifier at 6000 mc. yielded a 20 db gain, 1 mc. bandwidth and a 3 db noise figure.

In practicing the invention, a pump power lever of 20 milliwatts to ½ watt and a signal power level below 0.01 milliwatts (−20 dbm.) are typical.

In the up-converter of Figure 3, only one coaxial line low pass filter 24′ is employed for the high frequency signal input. The diode capacitor 22 is connected at one end to input filter 24′ and at its other end to the metallic wall in the common space within the two waveguides 10′ and 14′. These waveguides in this embodiment are shown to be in the same plane. The idler cavity or waveguide 14′ is tuned by a single tuning plunger 36, while the output frequency is derived from the open end of the idler waveguide. The waveguide 10′ is also tuned at one end by a single tuning plunger 38, while the pump frequency *fp* is supplied to the other end of the waveguide 10′. In an embodiment of the invention constructed in accordance with Figure 3, satisfactory results were obtained with a 700 mc. signal input *fs* supplied to the coaxial line low pass filter 24′, using a pump frequency *fp* of 10,500 mc. The output with a bandwidth of 1.7 megacycles obtained from the idler cavity or waveguide was centered about a frequency of 9800 mc. A 26.4 db gain and a 1.45 db overall noise figure was obtained. The frequency relation was $fp=fs+fi$, or stated another way, the pump frequency is the sum of the idling and signal frequencies. In the mixing process, both sum and difference frequencies are generated, but one of these is substantially suppressed because of the tuning of the idler cavity or waveguide 14′. Additional sideband suppression can be achieved by use of conventional bandpass filters. It is possible to obtain either the sum or the difference frequency for the output by properly tuning the idler cavity.

By means of the invention, gains in excess of 20 db can be obtained. The invention is not limited to the frequencies which were given above by way of example, and is useful with signals having lower and higher megacycle frequencies.

What is claimed is:

1. A low loss microwave parametric device comprising a waveguide cross consisting of a pair of waveguides extending at right angles to each other and coupled together in a region intermediate their ends, means for effectively tuning the lengths of both of said waveguides, a coaxial line low pass filter extending at right angles to both of said waveguides and terminating at said region, a diode operating as a non-linear reactance located in said region and extending into the space within both waveguides and coupled to one end of said coaxial line low pass filter, means for supplying a microwave input signal to the other end of said coaxial line low pass filter, means for supplying a microwave signal of a frequency higher than twice the frequency of said input signal to one of said waveguides, the other waveguide being tuned to a frequency which is the difference between the frequencies of said signals, and means for deriving from said device an output signal of a frequency related to the frequency of said input signal.

2. A low loss microwave parametric device comprising a waveguide cross consisting of a pair of waveguides of different dimensions extending at right angles to each other and coupled together in a region intermediate their ends, means for effectively tuning the lengths of both of said waveguides, a coaxial line low pass filter extending at right angles to both of said waveguides and terminating at said region, a diode operating as a non-linear capacitive reactance located in said region and extending into the space within both waveguides with one end of the diode coupled to one end of said coaxial line low pass filter, means for supplying a microwave input signal to the other end of said coaxial line low pass filter, means for supplying a microwave signal of a frequency appreciably higher than that of said input signal to one of said waveguides at a location removed from said region, the microwave signal of higher frequency differing from a two-to-one frequency relationship with regard to the frequency of said input signal, the other waveguide comprising a resonant circuit tuned to the difference between the frequencies of said signals, and means for deriving from said device an output signal of a frequency related to the frequency of said input signal.

3. A microwave parametric amplifier as defined in claim 2, wherein said means for deriving an output signal includes a second coaxial line low pass filter arranged along the longitudinal axis of said first coaxial line filter, said output coaxial line filter being coupled to the other end of said diode, whereby the output signal is of the same frequency as said input signal.

4. A microwave parametric converter as defined in claim 2, wherein said means for deriving an output signal is coupled to one end of said resonant circuit.

5. A microwave parametric amplifier as defined in claim 2, wherein said waveguides are of rectangular configuration, said other waveguide being wider than said one waveguide and being provided with tuning plungers on opposite sides of said region, said one waveguide being provided with a tuning plunger on one side of said region and with means for supplying the microwave signal of higher frequency thereto on the other side of said region, and an output coaxial line low pass filter coupled to the other end of said diode.

6. A microwave parametric converter for producing energy having a predetermined radio frequency, comprising an element operating as a non-linear reactance, a coaxial line low pass filter to one end of which can be applied radio frequency energy having a frequency lower than said predetermined frequency, the other end of said filter being coupled to said non-linear element, means coupled to said non-linear element for applying thereto radio frequency energy having a frequency equal to the sum of said predetermined frequency and the frequency of said radio frequency energy applied to said filter, an idling resonant circuit coupled to said non-linear element and tuned to the difference in the frequencies of the energy applied to said filter and of the energy applied by said means to said element, and means for deriving an output signal from said idling resonant circuit.

7. A microwave parametric amplifier for amplifying an input signal of a predetermined radio frequency, comprising an element operating as a non-linear reactance, a coaxial line low pass filter to one end of which can be applied radio frequency energy of said predetermined frequency, the other end of said filter being coupled to said non-linear element, means coupled to said non-linear element for applying thereto radio frequency energy having a frequency higher than said predetermined frequency, the radio frequency energy of higher frequency differing from a two-to-one frequency relationship with regard to said predetermined frequency, an idling resonant circuit coupled to said non-linear element and tuned to the difference in the frequencies of the energy applied to said filter and of the energy applied by said means to said element, and a second coaxial line low pass filter coupled to said non-linear element for deriving an output signal of a radio frequency equal to said predetermined frequency.

8. A low loss microwave parametric device comprising an element operating as a non-linear capacitive reactance, a coaxial line low pass filter to one end of which can be applied an input signal having a predetermined radio frequency, the other end of said filter being coupled to said non-linear element, means coupled to said non-linear element for applying thereto radio frequency energy having a frequency different from said predetermined frequency, the radio frequency energy applied to said element by said means differing from a two-to-one frequency relationship with regard to said predetermined frequency, an idling resonant circuit coupled to said non-linear element and tuned to the difference in the frequencies of said input signal and of the energy applied by said means to said element, and means for deriving from said element an output signal of a frequency related to said predetermined frequency.

9. An element in accordance with claim 8, wherein said capacitive reactance device has a non-linear reactance characteristic greater than two.

10. A parametric amplifier for amplifying an input signal of a predetermined radio frequency, comprising a diode element operating as a non-linear capacitive reactance and having input and output connections, a coaxial line low pass filter to one end of which can be applied radio frequency energy of said predetermined frequency, the other end of said filter being coupled to said input connection of said diode, means coupled to said diode element for applying thereto radio frequency energy having a frequency at least twice said predetermined frequency, a second coaxial line low pass filter having one end coupled to said output connection of said diode element for deriving an output signal of a radio frequency equal to said predetermined frequency.

References Cited in the file of this patent

Publication, Physical Review, July 1, 1937, page 317, vol. 107, No. 1.

Proceedings of the IRE, July 1958, pages 1383–1386, vol. 46, No. 7.